United States Patent
Kawoosa et al.

(10) Patent No.: US 12,298,346 B2
(45) Date of Patent: *May 13, 2025

(54) SECURED SCAN ACCESS FOR A DEVICE INCLUDING A SCAN CHAIN

(71) Applicant: TEXAS INSTRUMENTS INCORPORATED, Dallas, TX (US)

(72) Inventors: Mudasir Kawoosa, Bangalore (IN); Pervez Garg, Bangalore (IN); Prateek Giri, Chandigarh (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/435,452

(22) Filed: Feb. 7, 2024

(65) Prior Publication Data
US 2024/0241174 A1    Jul. 18, 2024

Related U.S. Application Data

(63) Continuation of application No. 17/951,488, filed on Sep. 23, 2022, now Pat. No. 11,927,633.

(51) Int. Cl.
| | |
|---|---|
| *G01R 31/00* | (2006.01) |
| *G01R 31/317* | (2006.01) |
| *G01R 31/3185* | (2006.01) |
| *G06F 11/10* | (2006.01) |

(52) U.S. Cl.
CPC ........... *G01R 31/318536* (2013.01); *G01R 31/31713* (2013.01); *G01R 31/31715* (2013.01); *G01R 31/318541* (2013.01); *G01R 31/318588* (2013.01)

(58) Field of Classification Search
CPC ...... G01R 31/318536; G01R 31/31713; G01R 31/31715; G01R 31/318541
See application file for complete search history.

(56) References Cited

U.S. PATENT DOCUMENTS

| | | | |
|---|---|---|---|
| 8,539,292 B2* | 9/2013 | Nieuwland | G01R 31/318541 714/733 |
| 9,766,289 B2* | 9/2017 | Parasrampuria | G01R 31/318385 |
| 10,184,980 B2 | 1/2019 | Maheshwari | |
| 10,386,413 B2* | 8/2019 | Payne | H03K 3/0375 |
| 10,866,280 B2* | 12/2020 | Narayanan | G01R 31/31724 |
| 11,144,677 B2 | 10/2021 | Doll | |
| 2019/0113566 A1* | 4/2019 | Maheshwari | G01R 31/31703 |
| 2022/0358230 A1 | 11/2022 | Narayanan | |
| 2023/0096746 A1 | 3/2023 | Woo | |
| 2023/0228815 A1 | 7/2023 | Bhunia | |

* cited by examiner

*Primary Examiner* — Justin R Knapp
(74) *Attorney, Agent, or Firm* — Mandy Barsilai Fernandez; Frank D. Cimino

(57) ABSTRACT

A device includes a scan chain including a plurality of storage elements and an output buffer; a shadow shift register having a shadow shift input coupled to a scan output of one of the storage elements of the scan chain; a signature register; and a comparator having a first input, a second input, and an output. The comparator first input is to receive a value of the shadow shift register, and the comparator second input is to receive a value of the signature register. The output buffer has a control input coupled to the comparator output, and the output buffer provides a high-impedance output responsive to the value of the shadow shift register being unequal to the value of the signature register.

20 Claims, 5 Drawing Sheets

SECURED SCAN ACCESS FOR A DEVICE INCLUDING A SCAN CHAIN

CROSS-REFERENCE TO RELATED APPLICATIONS

This application is a continuation of U.S. patent application Ser. No. 17/951,488, filed Sep. 23, 2022, which application is hereby incorporated herein by reference.

BACKGROUND

Integrated circuits (IC) are typically tested to uncover faults in circuitry within the ICs. For example, post-fabrication testing is usually performed on ICs. Typically, an IC is connected to an external tester via external pins of the IC. The tester then generates test patterns, which are provided to the IC via the external pins. The response of one or more internal blocks or circuitry in the IC to the test patterns may be read back by the tester, also via the external pins. Any faults in the IC may be determined by the tester based on analysis of the response. The IC itself may be designed with circuitry for enabling such testing, and such design techniques that incorporate testability features in an IC are generally referred to as design for testability (DFT). An example type of test that may be performed on an IC is a scan-based test.

SUMMARY

In an example of this description, a device includes a scan chain including a plurality of storage elements and an output buffer; a shadow shift register having a shadow shift input coupled to a scan output of one of the storage elements of the scan chain; a signature register; and a comparator having a first input, a second input, and an output. The comparator first input is to receive a value of the shadow shift register, and the comparator second input is to receive a value of the signature register. The output buffer has a control input coupled to the comparator output, and the output buffer provides a high-impedance output responsive to the value of the shadow shift register being unequal to the value of the signature register.

In another example of this description, a method is implemented by a device under test including a scan chain having a plurality of storage elements and an output buffer. The method includes receiving, in a scan in phase, a scan clock signal and a scan in signal to load the storage elements of the scan chain; and loading, in the scan in phase, a shadow shift register of the device under test from a scan output of one of the storage elements of the scan chain. Loading the shadow shift register is responsive to the scan clock signal. The method also includes receiving, in a capture phase, a signature clock signal and a signature data signal to load a signature register of the device under test, where a value of the shadow shift register is latched before the capture phase. The method further includes comparing, in a scan out phase, the latched value of the shadow shift register and a value of the signature register; unloading, in the scan out phase, the storage elements of the scan chain through the output buffer responsive to the scan clock signal and responsive to the latched value of the shadow shift register being equal to the value of the signature register; and providing, in the scan out phase, a high-impedance output by the output buffer responsive to the latched value of the shadow shift register being unequal to the value of the signature register.

In yet another example of this description, a method is for testing a device under test, where the device under test includes a scan chain having a plurality of storage elements and an output buffer. The method includes providing, in a scan in phase, a scan clock signal and a scan in signal to the device under test to load the storage elements of the scan chain, where a shadow shift register of the device under test is loaded responsive to the scan clock signal and a scan output of one of the storage elements of the scan chain. The method also includes providing, in a capture phase, a signature clock signal and a signature data signal to the device under test to load a signature register of the device under test, where a value of the shadow shift register is latched before the capture phase. The method further includes providing, in a scan out phase, the scan clock signal to the device under test to unload the storage elements of the scan chain through the output buffer. The output buffer provides a high-impedance output responsive to the latched value of the shadow shift register being unequal to a value of the signature register, and the output buffer provides an output signal corresponding to values of the storage elements of the scan chain responsive to the latched value of the shadow shift register being equal to the value of the signature register.

DETAILED DESCRIPTION

Figure 1:
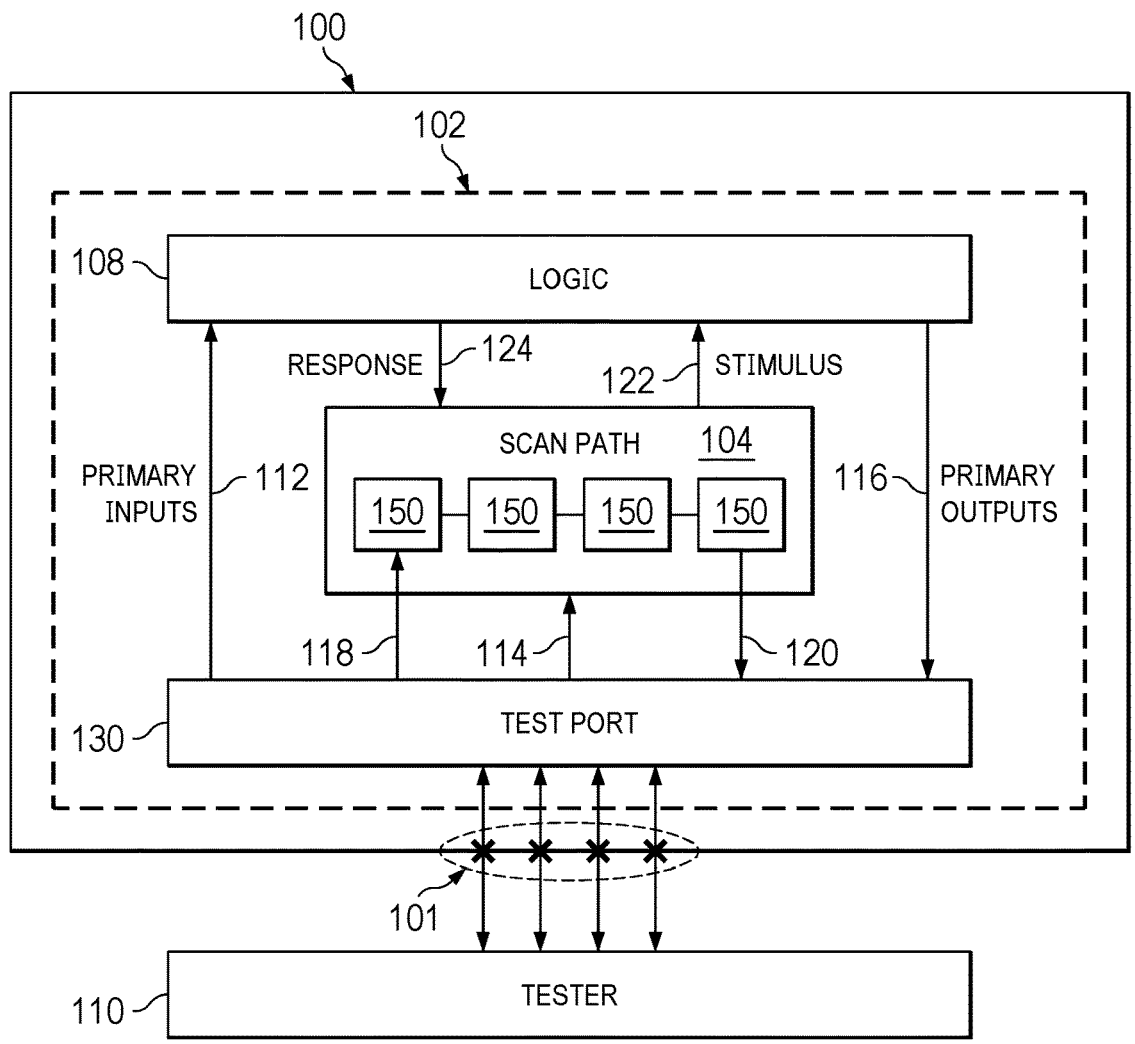
FIG. 1 is a schematic block diagram of a scan architecture in accordance with various examples.

In some cases, DFT and device (e.g., IC) security implementations have conflicting requirements. For example, devices are tested (e.g., by the device manufacturer) prior to shipping (e.g., to a customer), which may include access to secured component(s) and/or content(s) of the device. However, once a device is delivered (e.g., to the customer), access to such components and/or contents of the device, such as by a would-be hacker, should be restricted.

Scan architectures are useful to test digital circuitry in an IC, such as to implement a scan test as described above. Scan architectures scan in a test pattern (e.g., a series of bits), perform an operation with the test pattern and capture the results, and then scan out the results. During a scan test, access to design components (e.g., including macros, and secured islands) of the IC is provided to test for the presence of manufacturing defects. This access to the IC during a scan test is a potential security loophole, which can provide insight into the IC hardware design. Unprotected scan access can thus compromise design security, putting valuable device information at risk of being accessed by a would-be hacker. Accordingly, it is useful to provide secured scan access for an IC with robust security, and also while reducing device area and/or test time overhead constraints.

Examples of this description address the foregoing by providing a device (e.g., a device under test) having a scan chain that includes a plurality of storage elements (e.g., scan cells) and an output buffer. A shadow shift register has a shadow shift input that is coupled to a scan output of one of the scan cells of the scan chain. Accordingly, a test pattern that is shifted into the scan chain is also shifted into the shadow shift register from the scan output of one of the scan cells in the scan chain. In the examples described herein, the manufacturer of the device will have knowledge of which one of the scan cells provides its scan output to the input of the shadow shift register. Further, because the manufacturer of the device will also have knowledge of the applied test pattern, the manufacturer will be aware of the value of the shadow shift register when the test pattern has been fully loaded to the scan chain (e.g., at the end of a scan in phase). In some examples, the shadow shift register value is latched at the end of the scan in phase.

Because the manufacturer has knowledge of the resultant value of the shadow shift register at the end of the scan in phase, the value of the shadow shift register is useful as a dynamic value (e.g., that can vary from one test pattern to another test pattern) to provide secured scan access to the device under test. For example, the device also includes a signature register, which is also a shift register in some examples. In an example, the signature register is loaded during the capture phase that follows the scan in phase, such as responsive to a signature clock and a signature data signal. When loaded by the manufacturer, or a party authorized to access a scan mode of the device, the signature register is loaded with a value that is equal to the value of the shadow shift register at the end of the scan in phase. However, an unauthorized party would not have knowledge of what value to expect in the shadow shift register at the end of the scan in phase, and thus would not be able to load the signature register with a matching value. In some examples, the signature register value is latched at the end of the capture phase.

The device also includes a comparator that has a first input (e.g., to receive the latched value of the shadow shift register) and a second input (e.g., to receive the latched value of the signature register). In one illustrative example, the comparator performs a bitwise exclusive OR (XOR) operation based on the first and second inputs, and then performs an OR operation based on the bitwise XOR results. Other examples can include different comparator logic, provided that the output of the comparator is indicative of whether the first input value is equal to the second input value. For simplicity, the bitwise XOR+OR comparator logic is referred to below. Accordingly, an output of the comparator is logic LOW responsive to the first input value being equal to the second input value, and is logic HIGH responsive to the first input value being unequal to the second input value.

The output buffer of the scan chain has a control input that is coupled to the comparator output. The output buffer is configured to provide a high-impedance output responsive to the value of the shadow shift register being unequal to the value of the signature register (e.g., responsive to the comparator output being logic HIGH in the above example). Accordingly, if the signature register value does not match the shadow shift register value, as would be expected in the case of an attempted unauthorized scan access, data cannot be unloaded from the scan chain (e.g., read from the output buffer) during a scan out phase. On the other hand, the output buffer is configured to provide data from the scan chain responsive to the value of the shadow shift register being equal to the value of the signature register (e.g., responsive to the comparator output being logic LOW in the above example). Accordingly, if the signature register value matches the shadow shift register value, as would be expected in the case of an authorized scan access, data can be unloaded from the scan chain during the scan out phase.

In the above example, because a "tapping point" of the scan chain (e.g., the one of the scan cells' scan outputs to which the shadow shift input is coupled) is only known to the device manufacturer, a would-be hacker cannot easily predict a signature value that will match the latched value of the shadow shift register at the end of the scan in phase. Accordingly, unauthorized scan access is prevented, and security of the device is improved.

In some examples, scan access security is improved further by varying a size of the shadow shift register and the signature register, such as from one device design to another device design. For example, a first device design includes a shadow shift register and a signature register of a first size (e.g., 8 bits), while a second device design includes a shadow shift register and a signature register of a second size (e.g., 16 bits). The manufacturer, or a party authorized to access a scan mode of the device, has knowledge of the size of the shadow shift register and the signature register, and is thus able to load the signature register with an appropriately-sized value (and a corresponding appropriate number of signature clock pulses to load the value) and that will correspond to the value of the shadow shift register at the end of the scan in phase. However, an unauthorized party would not have knowledge of the size of the shadow shift register and the signature register, and thus would not be able to load the signature register with a matching value, or an appropriately sized value. For example, if the size of the signature register is 16 bits, and the unauthorized party attempts to load the signature register with an 8-bit value, the signature register will not match the shadow shift register at the end of the capture phase. In another example, if the size of the signature register is 8 bits, and the unauthorized party attempts to load the signature register with a 16-bit value, the signature register might not match the shadow shift register at the end of the capture phase (e.g., there is a non-zero, but small, probability that the last 8 bits of the loaded 16-bit value happen to match the shadow shift register value).

In some examples, scan access security is improved further by providing a multiplexed input to the shadow shift register, which selects from multiple possible tapping points of the scan chain to provide to the input of the shadow shift register. For example, a multiplexer (mux) has at least a first input coupled to a scan output of a first one of the scan cells in the scan chain, and a second input coupled to a scan output of a second one of the scan cells in the scan chain. A select input of the mux is configured to receive a latched value from another of the scan cells of the scan chain.

Similar to above, the manufacturer of the device will have knowledge of which one of the scan cells provides the select input value to the mux, and thus which of the mux inputs is provided to the shadow shift register for a given test pattern. For example, the scan cell value for the mux select input is latched from the previous test pattern (which would be known to the manufacturer) loaded into the scan chain. When a current test pattern is a first test pattern (e.g., there is no previous test pattern), the scan cell value for the mux select input is latched from a known reset value for the scan chain. Accordingly, because the manufacturer has knowledge of 1) the current test pattern, 2) the mux select input value to be applied for the current test pattern, and 3) the tapping point that is selected based on the mux select input value, the manufacturer will be aware of the value of the shadow shift register at the end of the scan in phase. The manufacturer (or other authorized party) will thus load the signature register accordingly during the capture phase, and data can be unloaded from the scan chain during the scan out phase. However, an unauthorized party would not know the scan cell(s) from which the mux select input value is derived, nor the tapping points in the scan chain that the mux selects from to provide as input to the shadow shift register, and thus would not be able to load the signature register with a matching value. Scan access is thus denied to the unauthorized party.

In some examples, scan access security is improved further by providing multiplexed test pins, so a given device pin is used for different input types for different test patterns. For example, during a first test pattern, a first test pin is configured to receive a scan clock signal and a second test pin is configured to receive a scan in signal (e.g., corresponding to test pattern data). However, during a second test pattern, the first test pin is configured to receive the scan in signal, while the second test pin is configured to receive the scan clock signal. In another example, during the scan in phase for the first test pattern, the first test pin is configured to receive the scan clock signal and the second test pin is configured to receive the scan in signal. However, during the capture phase for the first test pattern, the first test pin is configured to receive a signature data signal (e.g., receives a data signal instead of a clock signal as was the case in the scan in phase), while the second test pin is configured to receive a signature clock signal (e.g., receives a clock signal instead of a data signal as was the case in the scan in phase). Such test pin multiplexing further complicates a would-be hacker's ability to gain scan access to the device under test. These and other examples are described below with reference made to the accompanying figures.

FIG. 1 is a schematic block diagram of a scan architecture that illustrates how circuitry 102 within an integrated circuit (IC) 100 is configured into a scan chain during test. In an example normal functional configuration, circuit 102 is a functional circuit within IC 100, but in an example test configuration the circuit 102 appears as shown in FIG. 1.

Scan architectures can be applied at various circuit levels. In one example, the scan architecture of FIG. 1 represents the testing of a complete IC. In another example, the scan architecture of FIG. 1 represents the testing of an embedded intellectual property (IP) core sub-circuit within an IC, such as a digital signal processor (DSP) or central processing unit (CPU) core sub-circuit.

In the example of FIG. 1, the scan architecture includes a scan path circuit 104 (which is referred to as a scan path 104 for brevity), logic circuitry to be tested 108, and connection paths 112, 114, 116, 118, 120 to a tester 110 via a test port 130. The tester 110 is generally configured to: (1) output control signals to operate scan path 104 via control path 114; (2) output serial test stimulus patterns (which are also referred to as test patterns, or scan in data for brevity) to scan path 104 via scan input path 118; (3) input serial test response patterns (which are also referred to as scan out data for brevity) from scan path 104 via scan output path 120; (4) output parallel test stimulus patterns to logic 108 via primary input path 112; and (5) input parallel test response patterns from logic 108 via primary output path 116.

The scan path 104 is configured to output parallel test stimulus patterns to logic 108 via path 122, and to input parallel response patterns from logic 108 via path 124. In some examples, the tester 110 is configured to interface with the scan architecture by probing the die pads at wafer level, or by contacting package pins generally indicated at 101 that couple to test port 130 after the die is assembled into a package, for example.

While tester 110 connections to the primary inputs 112 and primary outputs 116 of logic 108 are shown, in other examples, the primary input and output connections are achieved by augmentation of scan path 104. For example, scan path 104 could be lengthened to include boundary scan cells located on each primary input and primary output of logic 108. The boundary scan cells are configured to provide primary inputs to and primary outputs from logic 108, via widened stimulus and response busses 122 and 124, respectively. In some examples, logic 108 is sufficiently tested by scan path 104, such that it is not necessary to provide primary inputs to and outputs from logic 108 via the tester or via the above described augmentation of scan path 104. For example, if the amount of logic 108 circuitry made testable by the use of scan path 104 in combination with the primary inputs and outputs is very small compared to the amount of logic 108 circuitry made testable by the scan path 104 alone, then the primary input and output connections to logic 108 may be removed without significantly affecting the test of logic 108 circuitry. To simplify the present description, the logic circuit 108 is considered sufficiently tested using only scan path 104. That is, the primary inputs 112 and primary outputs 116 are not used. However, in other examples, primary input and output connections to the tester or to an augmented scan path 104, as described above, are used.

The scan path 104 includes a plurality of scan cells 150, which are described in further detail below. The scan cells 150 are arranged serially between the scan input path 118 and the scan output path 120. As described further below, during a scan in phase, a test pattern is loaded into the scan cells 150 from the scan input path 118. During a capture phase, which follows the scan in phase, the test pattern is applied to the logic 108 via the stimulus bus 122 and a response is received by the scan cells 150 via the response bus 124. During a scan out phase, which follows the scan out phase, scan out data is unloaded from the scan cells 150, such as through an output buffer (not shown in FIG. 1 for simplicity) to the scan output path 120. A scan clock signal (e.g., provided via the control path 114) facilitates the loading and unloading of the scan cells 150, which is described further below.

Figure 2:
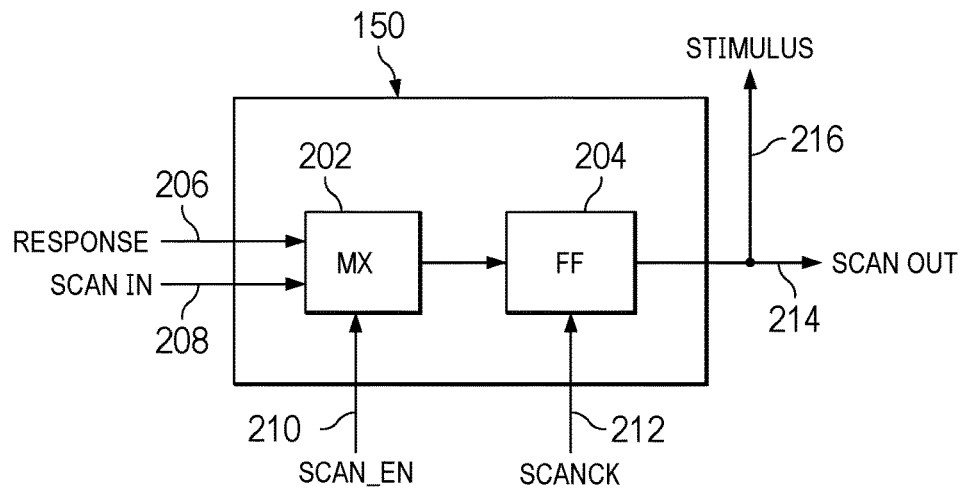
FIG. 2 is a schematic block diagram of a scan cell in accordance with various examples.

FIG. 2 is a schematic block diagram of an example scan cell 150, which is part of the scan path 104 as described above. The scan cell 150 includes a multiplexer 202 and a flip-flop (FF) 204. During a normal configuration of the circuit 100, multiplexer 202 and FF 204 receive control inputs, including a scan enable (SCAN_EN) input 210 and a scan clock (SCANCK) input 212 to input functional data from logic 108 via path 206 and output functional data via path 216. In the normal configuration, the SCANCK to FF 204 is typically a functional clock, and the SCAN_EN signal is set such that the FF clocks in functional data from logic 108 via path 206.

During a sequence of scan testing, multiplexer 202 and FF 204 receive control inputs SCAN_EN 210 and SCANCK 212 to capture test response data from logic 108 via path 206, shift data from scan input path 208 to scan output path 214, and apply test stimulus data to logic 108 via path 216. In the test configuration, the SCANCK to FF 204 is the scan clock and the SCAN_EN signal is operated to allow capturing of response data from logic 108 and shifting of data from scan input 208 to scan output 214. During test configuration, SCAN_EN is controlled by tester 110 via path 114 in some examples. In some examples, SCANCK is also controlled by the tester 110, but can be controlled by another source, such as a functional clock source. To simplify the present description, SCANCK and SCAN_EN are described as being controlled by the tester 110.

The scan inputs 208 and scan outputs 214 of multiple scan cells 150 are connected to form the serial scan path 104. The stimulus path 216 and response path 206 of multiple scan cells 150 in scan path 104 form the stimulus bussing path 122 and response bussing path 124, respectively, between scan path 104 and logic 108. Accordingly, the FF 204 of a scan cell 150 is shared between being used in the normal functional configuration and the test configuration.

Figure 3:
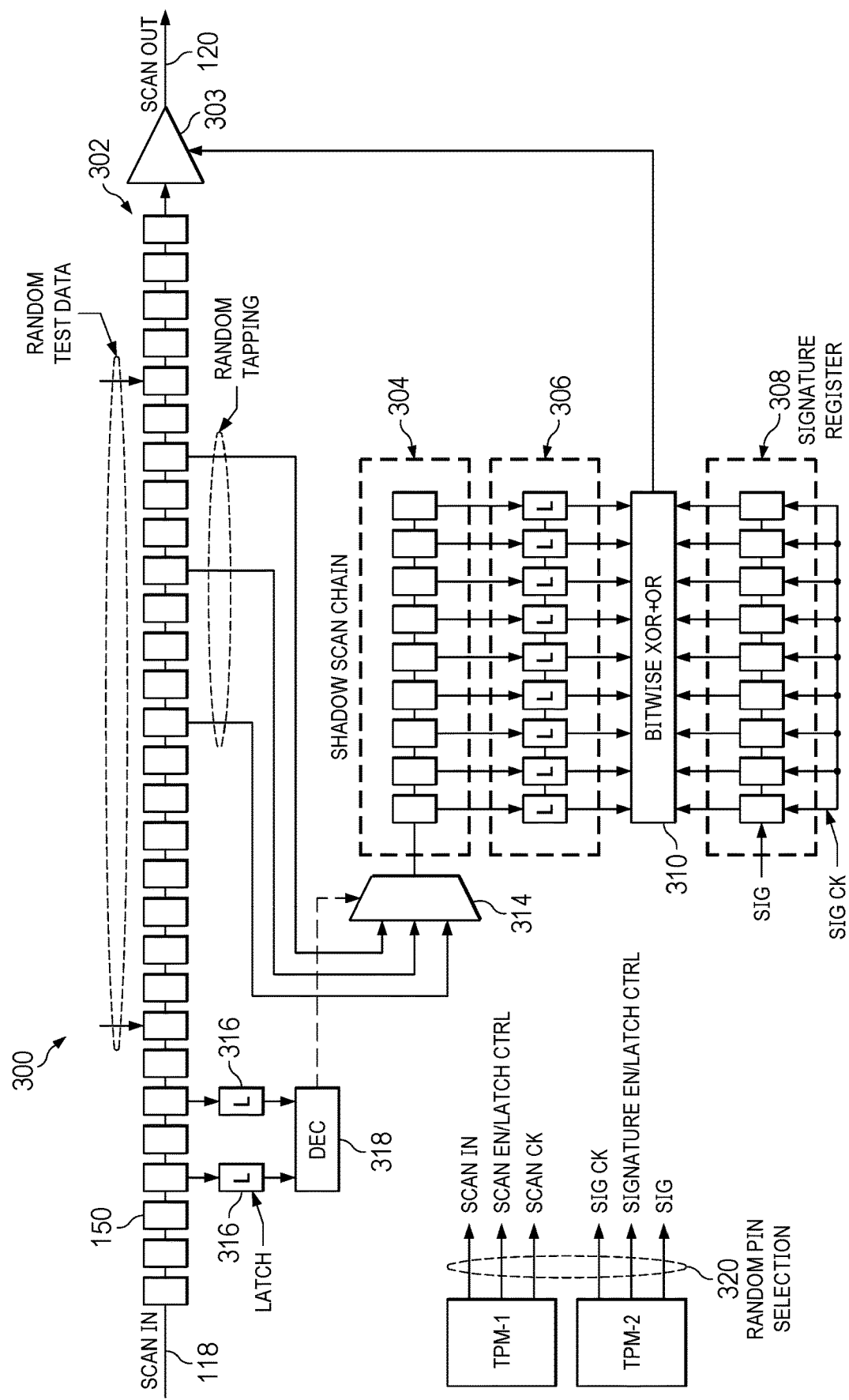
FIG. 3 is a schematic circuit diagram of a scan path of a device that includes a shadow shift register and a signature register in accordance with various examples.

FIG. 3 is a schematic circuit diagram of a scan path 300 of a device that includes a shadow shift register and a signature register in accordance with various examples. The scan path 300 includes a scan chain 302, which in turn includes multiple scan cells 150 as described above. Each scan cell 150 comprises a storage element, such as the FF 204 described above. A scan input path 118 is coupled to an input end of the scan chain 302, and a scan output path 120 is coupled to an output end of the scan chain 302, such as an output buffer 303 coupled to a final scan cell 150 of the scan chain 302.

During a scan in phase, a test pattern is loaded into the scan chain 302 from the scan input path 118. During a capture phase, which follows the scan in phase, the test pattern is applied to logic (e.g., logic 108 via the stimulus bus 122) and a response is received by the scan cells 150 (e.g., via the response bus 124). During a scan out phase, which follows the capture phase, scan out data is unloaded from the scan chain 302, such as through the output buffer 303 to the scan output path 120. A scan in signal (e.g., corresponding to test pattern data), and a scan clock signal (SCANCK) facilitate the loading and unloading of the scan chain 302, as well as a shadow shift register 304 described further below.

As described above, the scan path 300 is part of a device under test. A shadow shift register 304 has a shadow shift input that is coupled to a scan output of at least one of the scan cells 150 of the scan chain 302. For example, while FIG. 3 shows a more detailed arrangement, in a simplified example, the shadow shift input of the shadow shift register 304 is coupled to a single "tapping point" of the scan chain 302. A tapping point refers to the one of the scan cells' 150 scan outputs to which the shadow shift input is coupled.

Accordingly, a test pattern is shifted into the scan chain 302 responsive to the scan clock signal, and is also shifted into the shadow shift register 304 from the scan output of one of the scan cells 150 in the scan chain 302. A size of the shadow shift register 304 is not necessarily limited to the 9-bit shadow shift register 304 shown in FIG. 3, and could be sizes other than 9 bits.

In the examples described herein, the manufacturer of the device will have knowledge of which one of the scan cells 150 provides its scan output to the input of the shadow shift register 304. Further, because the manufacturer of the device will also have knowledge of the applied test pattern (e.g., the scan in signal provided during the scan in phase), the manufacturer will be aware of the value of the shadow shift register 304 when the test pattern has been fully loaded to the scan chain 302 (e.g., at the end of a scan in phase). In the specific example of FIG. 3, the shadow shift register 304 will contain the most recent 9 bits shifted through the one of the scan cells 150 that provides its scan output to the input of the shadow shift register 304. In some examples, the shadow shift register value 304 is latched in latch 306 at the end of the scan in phase (e.g., responsive to a latch control signal, described further below).

As described above, because the manufacturer has knowledge of the resultant value of the shadow shift register 304 at the end of the scan in phase, the value of the shadow shift register 304 is useful as a dynamic value (e.g., that can vary from one test pattern to another test pattern) to provide secured scan access to the device under test. For example, the scan path 300 of the device also includes a signature register 308, which is also a shift register in some examples. In an example, the signature register 308 is loaded during the capture phase that follows the scan in phase, such as responsive to a signature clock and a signature data signal. When loaded by the manufacturer, or a party authorized to access a scan mode of the scan path 300, the signature register 308 is loaded with a value that is equal to the value of the shadow shift register 304 at the end of the immediately-preceding scan in phase. However, an unauthorized party would not have knowledge of what value to expect in the shadow shift register 304 at the end of the scan in phase, and thus would not be able to load the signature register 308 with a matching value. In some examples, the signature register 308 value is latched at the end of the capture phase, although a specific latch structure is not shown in FIG. 3 for simplicity.

The scan path 300 of the device also includes a comparator 310 that has a first input (e.g., to receive the latched value of the shadow shift register 304 from the latch 306) and a second input (e.g., to receive the latched value of the signature register 308). As described above, in one illustrative example, the comparator 310 implements a bitwise XOR+OR comparator logic. Accordingly, an output of the comparator 310 is logic LOW responsive to the shadow shift register 304 (or the latch 306) value being equal to the signature register 308 value, and is logic HIGH responsive to the shadow shift register 304 (or the latch 306) value being unequal to the signature register 308 value.

The output buffer 303 of the scan chain 302 has a control input that is coupled to the comparator 310 output. The output buffer 303 is configured to provide a high-impedance output responsive to the value of the shadow shift register 304 being unequal to the value of the signature register 308 (e.g., responsive to the comparator 310 output being logic HIGH in the above example). Accordingly, if the signature register 308 value does not match the shadow shift register value 304, as would be expected in the case of an attempted unauthorized scan access, data cannot be unloaded from the scan chain 302 (e.g., read from the output buffer 303) during a scan out phase. On the other hand, the output buffer 303 is configured to provide data from the scan chain 302 responsive to the value of the shadow shift register 304 being equal to the value of the signature register 308 (e.g., responsive to the comparator 310 output being logic LOW in the above example). Accordingly, if the signature register 308 value matches the shadow shift register 304 value, as would be expected in the case of an authorized scan access, data can be unloaded from the scan chain 302 during the scan out phase.

In the above example, because a tapping point of the scan chain 302 is only known to the device manufacturer, a would-be hacker cannot easily predict a signature value that will match the latched value (e.g., in latch 306) of the shadow shift register 304 at the end of the scan in phase.

Accordingly, unauthorized scan access is prevented, and security of the scan path 300 is improved.

In some examples, scan access security is improved further by varying a size of the shadow shift register 304 and the signature register 308, such as from one device design to another device design. For example, a first device design includes a shadow shift register 304 and a signature register 308 of a first size (e.g., 9 bits as in FIG. 3), while a second device design includes a shadow shift register 304 and a signature register 308 of a second size (e.g., 16 bits). The manufacturer, or a party authorized to access a scan mode of the device, has knowledge of the size of the shadow shift register 304 and the signature register 308, and is thus able to load the signature register 308 with an appropriately-sized value (and a corresponding appropriate number of signature clock pulses to load the value) and that will correspond to the value of the shadow shift register 304 at the end of the scan in phase. However, an unauthorized party would not have knowledge of the size of the shadow shift register 304 and the signature register 308, and thus would not be able to load the signature register 308 with a matching value, or an appropriately sized value. Scan access to the scan path 300 of the device is thus denied to the unauthorized party.

In some examples, scan access security is improved further by providing a multiplexed input to the shadow shift register 304, which selects from multiple possible tapping points of the scan chain 302 to provide to the input of the shadow shift register 304. For example, a multiplexer (mux) 314 has at least a first input coupled to a scan output of a first one of the scan cells 150 in the scan chain 302, and a second input coupled to a scan output of a second one of the scan cells 150 in the scan chain 302. A select input of the mux 314 is configured to receive a latched value (e.g., from a latch 316) from another of the scan cells 150 of the scan chain 302. In some examples, the latched value (and thus the mux 314 select signal) is dynamic from one test pattern to another test pattern. For example, the latched value provided as the mux 314 select input is a first value for a first pattern, and is a second value for a second test pattern, where the second value is different than the first value.

Similar to above, the manufacturer of the scan path 300 of the device will have knowledge of which one of the scan cells 150 provides the select input value to the mux 314, and thus which of the mux 314 inputs is provided to the shadow shift register 304 for a given test pattern. For example, the scan cell 150 value for the mux select input is latched in latch 316 from a previous test pattern loaded into the scan chain 302, which would be known to the manufacturer. That is, for a current test pattern, the latch(es) 316 contains a value of its corresponding scan cell 150 from the previous (e.g., immediately preceding) test pattern at the end of the previous scan in phase. When the current test pattern is a first test pattern (e.g., there is no immediately-preceding test pattern), the latch(es) 316 contains a value of its corresponding scan cell 150 from a known reset value for the scan chain 302.

In either event, because the manufacturer has knowledge of 1) the current test pattern, 2) the mux 314 select input value to be applied for the current test pattern, and 3) the tapping point that is selected based on the mux 314 select input value, the manufacturer will be aware of the value of the shadow shift register 304 at the end of the scan in phase. The manufacturer (or other authorized party) will thus load the signature register 308 accordingly during the capture phase, and data can be unloaded from the scan chain 302 through the output buffer 303 during the scan out phase. However, an unauthorized party would not know the scan cell(s) 150 from which the mux 314 select input value is derived (e.g., the particular scan cells 150 that are latched by latch(es) 316), nor the tapping points in the scan chain 302 that the mux 314 selects from to provide as input to the shadow shift register 304, and thus would not be able to load the signature register 308 with a matching value. Scan access to the scan path 300 of the device is thus denied to the unauthorized party.

In examples that use a mux 314, such as that shown in FIG. 3, a relatively simpler example is that the mux 314 is a two-input mux 314 that selects from one of two random tapping points in the scan chain 302 based on a single-bit select signal (e.g., a single latch 316 latches a value of one scan cell 150 scan output).

However, in a more general example, the mux 314 is an n-input mux 314 that selects from one of n random tapping points in the scan chain 302 to provide as the input to the shadow shift register 304. In this example, the select signal for the mux 314 is based on, or responsive to, a latched value of a ceiling function (e.g., $\lceil \rceil$) of $\log_2(n)$ of the scan cell 150 scan outputs. In the specific example of FIG. 3, n=3 and thus the select signal is based on the latched value of two scan cell 150 scan outputs.

In some examples, a decoder 318 is configured to receive the latched value of the scan cell 150 scan outputs from latches 316 and to provide a decoded value responsive to the latched value of the $\lceil \log_2(n) \rceil$ scan cells 150 of the scan chain 302. The decoder 318 is useful in examples, such as that shown in FIG. 3, where a number of values represented by the $\lceil \log_2(n) \rceil$ scan cells 150 is greater than the number of mux 314 inputs. In FIG. 3, the decoder 318 provides one of three output values based on four input values. In examples that include the decoder 318, the mux 314 is configured to provide one of its n inputs as the mux 314 output responsive to the decoded value from the decoder 318.

The scan path 300 may also include multiplexed test pins 320 to provide further scan access security. For example, multiple device pins coupled to the scan path 300 are multiplexed, such that a given device pin can be used for different input types for different test patterns, or for different phases of a test pattern.

For example, during a first test pattern, a first test pin of the multiplexed test pins 320 is configured to receive a scan clock signal (SCANCK) and a second test pin of the multiplexed test pins 320 is configured to receive a scan in signal (e.g., corresponding to test pattern data). However, during a second test pattern, the first test pin is configured to receive the scan in signal, while the second test pin is configured to receive the scan clock signal. That is, a same test pin receives either a clock signal or a data signal depending on the test pattern.

In another example, during the scan in phase for the first test pattern, the first test pin of the multiplexed test pins 320 is configured to receive the scan clock signal (SCANCK) and the second test pin of the multiplexed test pins 320 is configured to receive the scan in signal. However, during the capture phase for the first test pattern, the first test pin is configured to receive a signature data signal (e.g., receives a data signal instead of a clock signal as was the case in the scan in phase), while the second test pin is configured to receive a signature clock signal (e.g., receives a clock signal instead of a data signal as was the case in the scan in phase). The different multiplexing of test pins on a per-phase basis can be continued to a subsequent test pattern, such that for the scan in phase for a second test pattern, the first test pin is configured to receive the scan in signal, and the second test pin is configured to receive the scan clock signal (SCANCK). During the capture phase for the second test pattern, the first test pin is configured to receive the signature clock signal, and the second test pin is configured to receive the signature data signal. Such test pin multiplexing 320 further complicates a would-be hacker's ability to gain scan access to the scan path 300 of the device under test.

Figure 4:
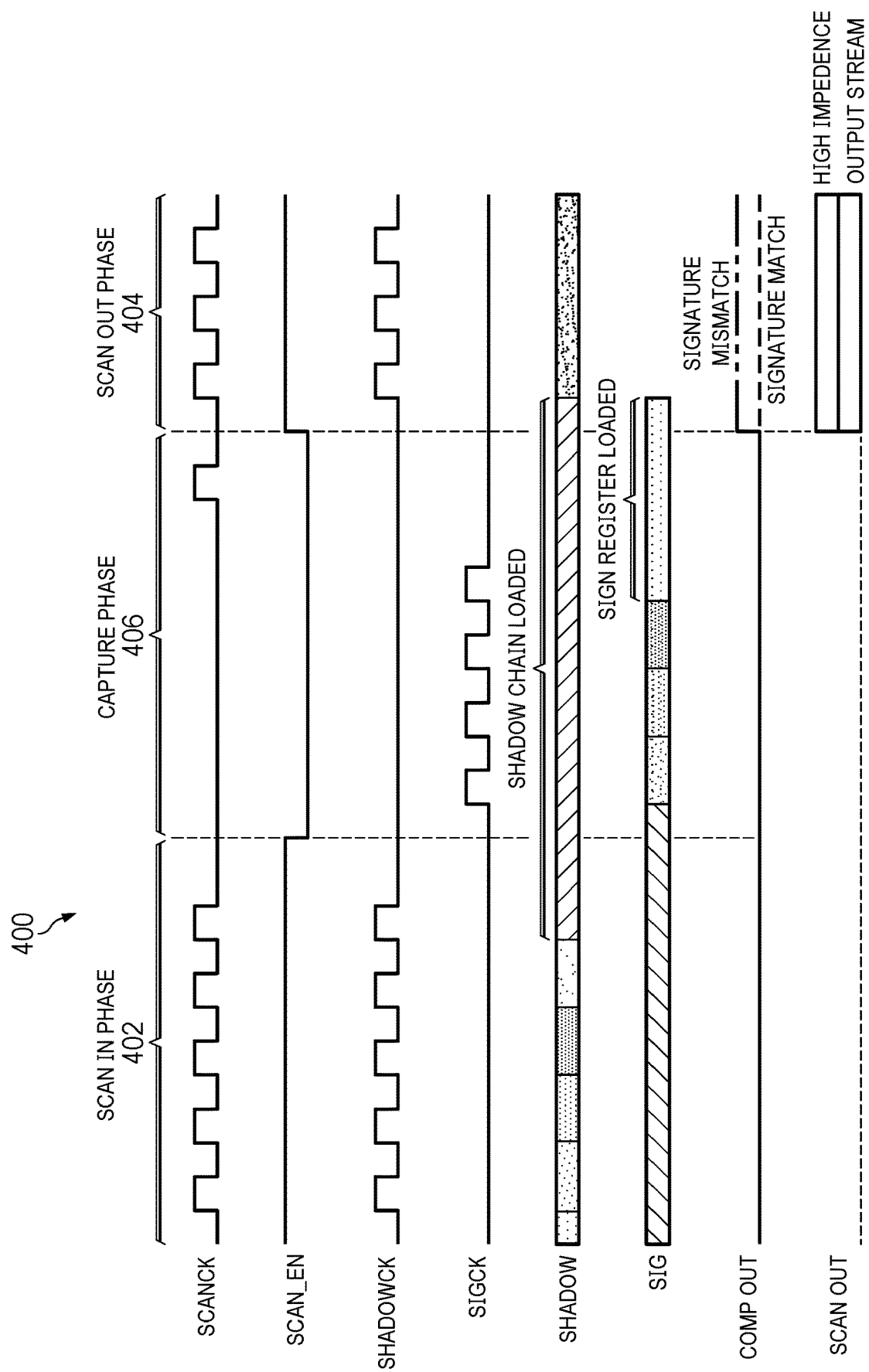
FIG. 4 is a graph of waveforms that represent various functionality of the scan path of FIG. 3 in accordance with various examples.

FIG. 4 is a graph of waveforms 400 that represent various functionality of the scan path 300 of FIG. 3 in accordance with various examples. The waveforms 400 include a SCANCK waveform that corresponds to the SCANCK signal 212 in FIG. 2. In some examples, the SCANCK signal clocks data through both the scan chain 302 and the shadow shift register 304. However, in other examples, such as that shown in FIG. 4, the waveforms 400 also include a SHADOWCK waveform that corresponds to a signal that clocks data through the shadow shift register 304, but which is described as functionally the same as SCANCK for simplicity. The waveforms 400 also include a SCAN_EN signal that corresponds to the SCAN_EN signal 210 described above. The waveforms 400 include a SIGCK signal that corresponds to a signal that clocks data into the signature register 308. The SHADOW waveform represents data provided to the shadow shift register 304 from the scan chain 302 (e.g., from the scan output of a scan cell 150 of scan chain 302). The SIG waveform represents signature data provided to the signature register 308, such as from one of the multiplexed test pins 320. The COMP OUT waveform represents an output of the comparator 310. Finally, the SCAN OUT waveform represents an output of the output buffer 303, which enables the scan chain 302 to be unloaded during a scan out phase.

In FIG. 4, waveforms 400 begin in the scan in phase for a particular test pattern, which continues until time 402. The capture phase starts at time 402 and continues until time 404. Finally, a scan out phase for the particular test patterns begins at time 404 and continues to the end of the graph of FIG. 4.

As described above, during the scan in phase, SCAN_EN is asserted and thus SCANCK functions to clock data (e.g., a test pattern) into the scan chain 302. At the same time, SHADOWCK functions to clock data from the tapping point of the scan chain 302, such as selected by the mux 314, into the shadow shift register 304. At the end of the scan in phase, the shadow shift register 304 is loaded, and can be latched into the latch 306, such as responsive to SCAN_EN being de-asserted.

At time 402, the SCAN_EN signal is de-asserted, which indicates the beginning of the capture phase. The SIGCK signal clocks in signature data (SIG) to the signature register 308, and SIGCK and SIG are also received from the multiplexed test pins 320. As described above, because the manufacturer has knowledge of the resultant value of the shadow shift register 304 at the end of the scan in phase (e.g., at time 402), the manufacturer can provide the appropriate SIG data to load the signature register 308 with a value that is equal to the value of the shadow shift register 304 at the end of the immediately-preceding scan in phase (e.g., at time 402).

Prior to time 404, and while SCAN_EN is de-asserted, SCANCK is operated such as during capture phase 406 to function as a functional clock for combinational logic (e.g., logic 108) coupled to the scan chain 302. As described above, this allows the scan chain 302 to output or apply the loaded test pattern to the logic 108 (e.g., via the stimulus bus 122) and to receive a response by the scan cells 150 of the scan chain 302 (e.g., via the response bus 124).

At time 404, the SCAN_EN signal is again asserted, which indicates the beginning of the scan out phase. At time 404, if an authorized party has properly loaded the signature register 308 (e.g., with a value that matches the latched value of the shadow shift register 304), COMP OUT is a logic LOW value, which indicates a signature match as explained above. On the other hand, if an unauthorized party has improperly loaded the signature register 308, or not loaded the signature register 308, COMP OUT is a logic HIGH value, which indicates a signature mismatch as explained above.

The output buffer 303 of the scan chain 302 is configured to provide a high-impedance output (SCAN OUT) responsive to a signature mismatch, which prevents data from being unloaded from the scan chain 302 (e.g., read from the output buffer 303) during the scan out phase. On the other hand, the output buffer 303 is configured to provide data from the scan chain 302 (SCAN OUT) responsive to the value of the shadow shift register 304 being equal to the value of the signature register 308 (e.g., responsive to the comparator 310 output being logic LOW at time 404). Accordingly, if the signature register 308 value matches the shadow shift register 304 value, as would be expected in the case of an authorized scan access, data can be unloaded from the scan chain 302 during the scan out phase.

Figure 5:
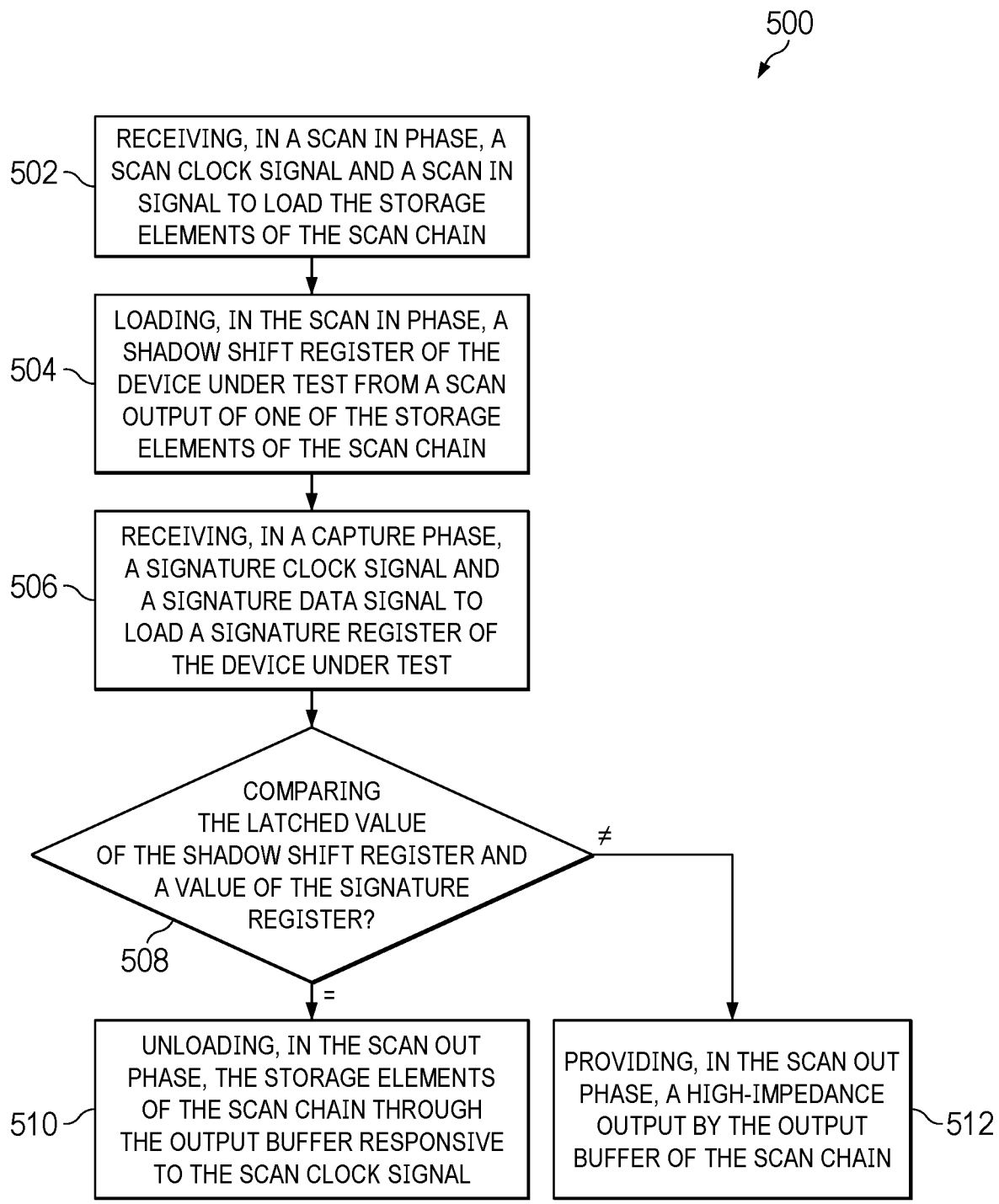
FIG. 5 is a flow chart of a method for providing secured scan access to a device under test in accordance with various examples.

FIG. 5 is a flow chart of a method 500, implemented by a device under test, for providing secured scan access to the device in accordance with various examples. The method 500 is implemented by a device under test including a scan chain having a plurality of storage elements and an output buffer, such as the scan chain 302 described above. The method 500 begins in block 502 with receiving, in a scan in phase, a scan clock signal and a scan in signal to load the storage elements of the scan chain.

The method 500 continues in block 504 with loading, in the scan in phase, a shadow shift register 304 of the device under test from a scan output of one of the storage elements (e.g., scan cells 150) of the scan chain 302. The loading is responsive to the scan clock signal (e.g., SCANCK or SHADOWCK in FIG. 4).

The method 500 continues further in block 506 with receiving, in a capture phase, a signature clock signal (e.g., SIGCK in FIG. 4) and a signature data signal (e.g., SIG in FIG. 4) to load a signature register 308 of the device under test. As described above, a value of the shadow shift register 304 is latched before the capture phase.

The method 500 continues still further in block 508 with comparing (e.g., by comparator 310), in a scan out phase, the latched value of the shadow shift register 304 and a value of the signature register 308. If the latched value of the shadow shift register 304 is equal to the value of the signature register 308, the method 500 continues in block 510 with unloading, in the scan out phase, the storage elements (e.g., scan cells 150) of the scan chain 302 through the output buffer 303 responsive to the scan clock signal.

If the latched value of the shadow shift register 304 is unequal to the value of the signature register 308, the method instead continues in block 512 with providing, in the scan out phase, a high-impedance output by the output buffer 303 of the scan chain 302.

As described above, a would-be hacker cannot easily predict a signature value that will match the latched value (e.g., in latch 306) of the shadow shift register 304 at the end of the scan in phase. Accordingly, the method 500 prevents an unauthorized scan access, and security of the device including the scan path 300 is improved.

Figure 6:
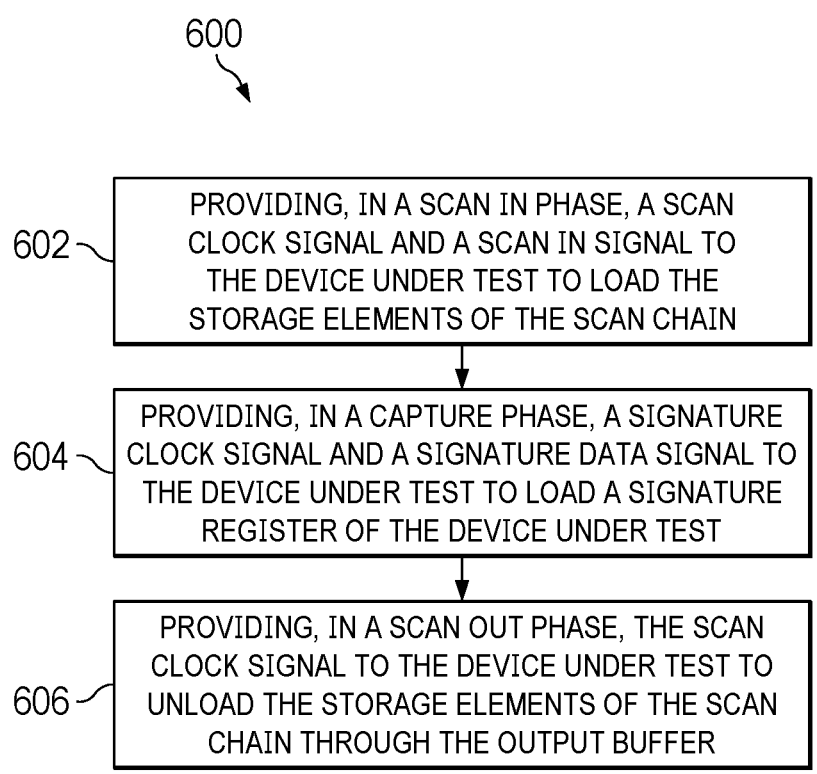
FIG. 6 is a flow chart of a method of testing a device under test in accordance with various examples.

FIG. 6 is a flow chart of a method 600 of testing a device under test. Similar to above, the device under test includes a scan chain including a plurality of storage elements and an output buffer, such as the scan chain 302.

The method 600 begins in block 602 with providing, in a scan in phase, a scan clock signal and a scan in signal to the device under test to load the storage elements of the scan chain. In addition to loading the storage elements (e.g., scan cells 150) of the scan chain 302, a shadow shift register 304 of the device under test is also loaded responsive to the scan clock signal and a scan output of one of the storage elements of the scan chain 302. As described above, SCANCK and SHADOWCK are functionally similar and generally operated in a same manner, so that the scan chain 302 and the shadow shift register 304 are loaded together during the scan in phase.

The method 600 continues in block 604 with providing, in a capture phase, a signature clock signal (e.g., SIGCK in FIG. 4) and a signature data signal (e.g., SIG in FIG. 4) to the device under test to load a signature register 308 of the device under test. As described above, a value of the shadow shift register 304 is latched before the capture phase.

The method 600 continues further in block 606 with providing, in a scan out phase, the scan clock signal to the device under test to unload the storage elements of the scan chain 302 through the output buffer 303. The output buffer 303 is configured to provide an output signal corresponding to values of the storage elements of the scan chain 302 responsive to the latched value of the shadow shift register 304 being equal to the value of the signature register 308. However, the output buffer 303 is configured to provide a high-impedance output responsive to the latched value of the shadow shift register 304 being unequal to a value of the signature register 308.

As described above, a would-be hacker cannot easily predict a signature value that will match the latched value (e.g., in latch 306) of the shadow shift register 304 at the end of the scan in phase. Accordingly, the method 600 prevents an unauthorized scan access, and security of the device including the scan path 300 is improved.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A device comprising:
    a scan chain having a plurality of scan cells, a first input, and a first output;
    an output buffer having a first input coupled to the first output of the scan chain, and an enable input;
    a first shift register having an input coupled to a second output of the scan chain;
    a second register; and
    a comparator having a first input coupled to the first shift register, a second input coupled to the second register, and an output coupled to the enable input of the output buffer.

2. The device of claim 1, further comprising a multiplexer having a first input coupled to the second output of the scan chain, a second input coupled to a third output of the scan chain, and an output coupled to the input of the first shift register.

3. The device of claim 2, wherein the multiplexer comprises a selection input configured to receive a selection signal based on a fourth output of the scan chain.

4. The device of claim 2, further comprising a decoder having an output coupled to a selection input of the multiplexer.

5. The device of claim 4, wherein the decoder comprises a first input coupled to a fourth output of the scan chain.

6. The device of claim 5, further comprising a first latch having an input coupled to the fourth output of the scan chain, and an output coupled to the first input of the decoder.

7. The device of claim 1, further comprising a latch having an input coupled to the first shift register, and an output coupled to the first input of the comparator.

8. The device of claim 1, wherein each scan cell of the plurality of scan cells comprises:
- a multiplexer having first and second inputs, a selection input, and an output; and
- a flip-flop having a first input coupled to the output of the multiplexer, and a clock input.

9. The device of claim 8, wherein:
- the selection input of the multiplexer of each scan cell of the plurality of scan cells is configured to receive a scan enable signal;
- The clock input of the flip-flop of each scan cell of the plurality of scan cells is configured to receive a clock signal; and
- the first input of the multiplexer of a first scan cell of the plurality of scan cells is configured to receive a scan input signal.

10. The device of claim 9, wherein the device is configured to:
- during a scan-in phase, shift values of the scan input signal into the scan chain using the first input of the multiplexer of each scan cell of the plurality of scan cells;
- during a capture phase occurring after the scan-in phase, latch values into the scan chain using the second input of the multiplexer of each scan cell of at least some of the plurality of scan cells; and
- during a scan-out phase occurring after the capture phase, assert the output of the comparator based on content of the second register and generate a scan out signal at an output of the output buffer when the output of the comparator is asserted.

11. The device of claim 10, further comprising a latch having an input coupled to the first shift register, and an output coupled to the first input of the comparator, wherein the comparator is configured to assert the output of the comparator when content of the latch matches content of the second register.

12. The device of claim 11, wherein the latch is configured to capture content of the first shift register in response to the scan enable signal is deasserted.

13. The device of claim 1, wherein the first output of the scan chain is coupled to an output of a last scan cell of the scan chain.

14. The device of claim 1, wherein the output buffer is configured to operate in high impedance mode when the output of the comparator is deasserted.

15. A method comprising:
- receiving a scan input signal at a first input of a scan chain, the scan chain having a first output coupled to an input of an output buffer;
- during a scan-in phase,
  - shifting values of the scan input signal into the scan chain, and
  - shifting values into a first shift register having an input coupled to a second output of the scan chain;
- during a capture phase occurring after the scan-in phase, latching content of the first shift register into a first latch; and
- during a scan-out phase occurring after the capture phase, in response to content of the first latch matching content of a second register, enabling the output buffer to generate, at an output of the output buffer, a scan out signal based on the first output of the scan chain.

16. The method of claim 15, wherein a scan enable signal is asserted during the scan-in phase and during the scan-out phase, and wherein the scan enable signal is deasserted during the capture phase.

17. The method of claim 16, wherein latching content of the first shift register into the first latch comprises latching content of the first shift register into the first latch in response to the scan enable signal being deasserted.

18. The method of claim 15, wherein shifting values of the scan input signal into the scan chain comprises shifting values of the scan input signal into the scan chain based on a first clock signal, the method further comprising, during the capture phase, shifting data into the second register based on a second clock signal.

19. The method of claim 15, wherein the output of the output buffer is at a same state during the scan-in phase and the capture phase.

20. The method of claim 15, wherein the output of the output buffer is at a high-impedance state in response to the content of the first latch not matching the content of the second register.

* * * * *